United States Patent [19]

Kano et al.

[11] Patent Number: 5,759,646

[45] Date of Patent: Jun. 2, 1998

[54] VESSEL OF PYROLYTIC BORON NITRIDE

[75] Inventors: Shoji Kano; Nobuo Kawada; Ryoji Nakajima; Yukio Kurosawa, all of Gunma-ken, Japan

[73] Assignee: Shin-Etsu Chemical Co., Ltd., Tokyo, Japan

[21] Appl. No.: 699,148

[22] Filed: Aug. 16, 1996

[30] Foreign Application Priority Data

Aug. 22, 1995 [JP] Japan .................................. 7-213228

[51] Int. Cl.⁶ .......................................................... B01L 3/04
[52] U.S. Cl. .................. 428/34.4; 428/34.6; 422/102; 422/248; 422/99
[58] Field of Search ............................ 422/102, 248, 422/99; 428/34.4, 34.6

[56] References Cited

U.S. PATENT DOCUMENTS 5,158,750  10/1992  Finicle .................................. 422/102

FOREIGN PATENT DOCUMENTS 039774  11/1981  European Pat. Off. .
2294532  5/1996  United Kingdom .

OTHER PUBLICATIONS

Derwent Publications—AN 94–196945 & JP 06 135 793 Abstract.
Derwent Publications—AN 94–196946 & JP 06 135 794 Abstract.
Patent Abstracts of Japan, vol. 015, No. 213, May 30, 1991 and JP 03 060114, Mar. 15, 1961.

*Primary Examiner*—Charles Nold
*Attorney, Agent, or Firm*—McAulay Fisher Nissen Goldberg & Kiel, LLP

[57] ABSTRACT

Proposed is an improvement in a vessel, e.g., crucible, of pyrolytic boron nitride (PBN) used, for example, in the process of molecular beam epitaxy for melting silicon and the like at a high temperature. Different from conventional PBN crucibles used for such a process, in which contamination of high-purity silicon is unavoidable by the reaction of molten silicon with PBN or a thermal decomposition products of boron nitride, the inventive PBN vessel is provided on the surface with a protective coating layer of pyrolytic graphite or a refractory metal such as platinum so as not to cause troubles due to contamination of high-purity silicon melted therein with the crucible materials.

5 Claims, 1 Drawing Sheet

VESSEL OF PYROLYTIC BORON NITRIDE

BACKGROUND OF THE INVENTION

The present invention relates to a novel vessel made from pyrolytic boron nitride. More particularly, the invention relates to a vessel of pyrolytic boron nitride such as a crucible suitable for use in the process of molecular beam epitaxy for the manufacture of various kinds of fine semiconductor devices.

As is known, articles of pyrolytic boron nitride, referred to as PBN hereinafter, are prepared from ammonia $NH_3$ and boron trifluoride $BF_3$ as the starting materials by the thermal CVD method at a temperature of, for example, 1700° C., in which the starting gaseous compounds are converted into PBN which is deposited on the surface of a substrate in the form of a coating layer followed by releasing of the thus formed PBN layer from the substrate.

A shaped article of PBN prepared in this manner has excellent heat resistance and resistance against thermal shocks and can be imparted with a very high purity by suitably selecting the starting materials so that PBN articles are suitable for use as a melting vessel to be used under high vacuum such as a cell for molecular beam epitaxy (MBE) and the like in the manufacturing technology of semiconductor devices.

A problem relative to the use of a vessel of PBN, however, is that the vessel cannot be used for a melting treatment or vapor deposition of a substance having reactivity with PBN or boron and/or nitrogen as the thermal decomposition products of PBN at a high temperature under high vacuum.

SUMMARY OF THE INVENTION

The present invention accordingly has an object to provide a novel and improved vessel of PBN free from the above described problems in the conventional PBN vessels and suitable for use, for example, in the molecular beam epitaxy and the like for the manufacture of semiconductor devices.

Thus, the PBN vessel provided by the present invention is a vessel which comprises: (a) a base body in the form of a vessel made from pyrolytic boron nitride and; (b) a protective coating layer formed from a carbonaceous material or a refractory metal at least on the inner surface of the base body.

DETAILED DESCRIPTION OF THE PREFERRED EMBODIMENTS

As is described above, the PBN vessel of the invention is characterized in that a protective coating layer of a carbonaceous material or a refractory metal is formed at least on the inner surface of the base body made from conventional PBN so as to prevent the reaction of PBN or the decomposition products thereof and the material melted in the vessel.

In the following, the inventive PBN vessel is illustrated in detail by way of a description of the manufacturing process thereof making reference to FIGS. 1A to 1C of the accompanying drawing.

Figure 1A:
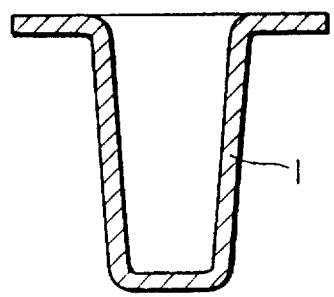
FIGS. 1A, 1B and 1C each illustrate a step in the manufacturing process of the inventive PBN vessel.
Figure 1B:
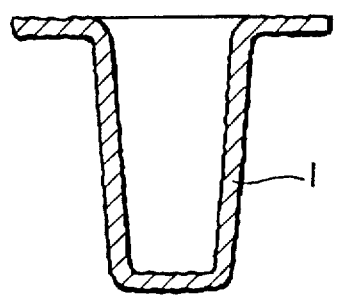
Figure 1C:
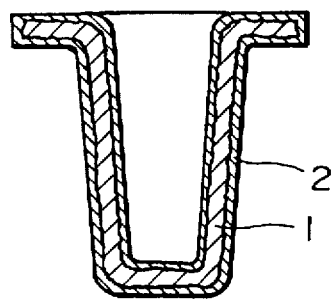

FIG. 1C illustrates an axial cross sectional view of the inventive PBN vessel in the form of a crucible consisting of a base body 1 of PBN and a protective coating layer 2 of a carbonaceous material or a refractory metal formed on the whole surface of the base body 1.

The base body 1 of the inventive PBN vessel illustrated in FIG. 1A by an axial cross sectional view is made from PBN as the material and prepared by a conventional method in which PBN is formed by the known pyrolytic method, for example, from ammonia and boron trifluoride as the starting materials and the PBN is deposited on a core body to make up a layer having an appropriate thickness followed by the removal of the core body from the thus formed PBN layer.

In the next place, the surface of the thus prepared base body 1 of PBN, on which the protective coating layer 2 is to be formed, is roughened by a suitable method such as sandblasting and the like so that the base body 1 has a roughened surface as is illustrated in FIG. 1B by an axial cross sectional view.

In the last step of preparation, a protective coating layer 2 of a carbonaceous material or a refractory metal is formed on the thus roughened surface of the base body 1 of PBN as is illustrated in FIG. 1C. When the protective coating layer 2 is made from a carbonaceous material, a coating layer 2 of graphite can be formed by conducting a pyrolytic reaction of a gaseous hydrocarbon compound in the presence of the base body 1 so as to deposit the pyrolytic graphite on the surface of the base body 1. The protective coating layer 2 preferably has a thickness in the range from 0.005 mm to 0.025 mm or, more preferably, in the range from 0.015 mm to 0.020 mm. When the thickness of the protective coating layer 2 is too small, the protective coating layer 2 is sometimes incomplete to have defects resulting in a problem of contamination while, when the thickness thereof is too large, an undesirable phenomenon of exfoliation or falling of the coating layer 2 sometimes takes place due to an increase in the internal stress within the layer 2.

Since the object of formation of the protective coating layer 2 consists in preventing contamination of the material contained in the vessel with the material of the vessel at elevated temperatures, it is essential that the protective coating layer 2 is inert to and has no reactivity with the material contained in the vessel in a molten state at a high temperature when the PBN vessel is used in the molecular beam epitaxy, in which the material most frequently used is, for example, gallium, arsenic or silicon.

Although gallium and arsenic have no reactivity with PBN per se, silicon may be converted into a nitride in the vapor-deposited film when the vapor deposition is performed by melting silicon in a PBN vessel. Materials having no reactivity with molten silicon and suitable for the protective coating layer 2 include a carbonaceous material, which is preferably pyrolytic graphite, and a refractory metal, which is preferably platinum. The protective coating layer 2 made from such a material is inert to and has no reactivity with a melt of the above mentioned materials including silicon used in the molecular beam epitaxy using the vessel as the MBE cell conducted at a temperature of 1300° C. or higher under a vacuum pressure of $10^{-6}$ Torr or lower.

In the following, the surface-protected PBN vessel of the invention is described in more detail by way of an example and a comparative example.

EXAMPLE

Pyrolytic process was conducted in a CVD chamber with a 3:1 by volume gaseous mixture of ammonia and boron trifluoride in the presence of a core mold at a temperature of 1300° C. under a pressure of 2 Torr to form a PBN layer having a thickness of 1 mm on the surface of the core mold followed by removal of the core mold to give a base body of PBN in the form of a crucible having a lip diameter of 60 mm, inner diameter of 30 mm, depth of 105 mm and wall thickness of 1 mm as is illustrated in FIG. 1A.

In the next place, the base body of PBN was subjected to a sandblasting treatment on the whole surface thereof so as to impart the surface with an average surface roughness Sa of 2 μm as is illustrated in FIG. 1B.

Further, a protective coating layer of pyrolytic graphite having a thickness of 0.025 mm was formed on the thus roughened surface of the PBN base body by conducting the pyrolytic reaction of methane at a temperature of 1650° C. under a pressure of 5 Torr to give a surface-protected PBN crucible of the invention.

The thus obtained surface-protected PBN crucible was subjected to a test use as a vessel for the formation of a vapor-deposited high-purity silicon film. Thus, 100 g of granules of silicon having a purity of 99.99999% were introduced into the crucible which was set on the K cell of an MBE chamber and, after thoroughly flushing the atmosphere in the chamber with argon gas, the silicon granules were melted by heating at a temperature higher than the melting point of silicon under a vacuum pressure of $10^{-6}$ Torr to effect vapor-phase deposition of a silicon film. An X-ray diffractometric examination was undertaken for the thus formed silicon film to find no diffraction peaks which could not be assigned to polycrystalline silicon indicating that the vapor-deposited film thus obtained was a high-purity silicon film.

Comparative Example

The process of vapor-phase deposition of a high-purity silicon film was conducted in the same manner as in the Example described above excepting the use of a PBN crucible having no protective coating film of pyrolytic graphite. The X-ray diffractometric examination of the vapor-deposited silicon film gave a diffraction diagram having several peaks assignable to a crystalline phase of silicon nitride besides the peaks assigned to polycrystalline silicon so that a high-purity silicon film could not be obtained.

What is claimed is:

1. A vessel which comprises:
    (a) a base body made from pyrolytic boron nitride in the form of a vessel; and
    (b) a protective coating layer formed from a carbonaceous material or a refractory metal at least on the inner surface of the base body.

2. The vessel as claimed in claim 1 in which the protective coating layer is made from a carbonaceous material which is pyrolytic graphite.

3. The vessel as claimed in claim 1 in which the protective coating layer is made from a refractory metal which is platinum.

4. The vessel as claimed in claim 1 in which the protective coating layer has a thickness in the range from 0.005 mm to 0.025 mm.

5. The vessel as claimed in claim 1 in which the base body has a surface, on which the protective coating layer is formed, roughened by sandblasting.

* * * * *